United States Patent
Song

(10) Patent No.: US 9,508,819 B2
(45) Date of Patent: Nov. 29, 2016

(54) SEMICONDUCTOR DEVICE FOR COMPENSATING INTERNAL DELAY, METHODS THEREOF, AND DATA PROCESSING SYSTEM HAVING THE SAME

(71) Applicant: Samsung Electronics Co., Ltd., Suwon-Si, Gyeonggi-Do (KR)

(72) Inventor: Kwan Jae Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/492,595

(22) Filed: Sep. 22, 2014

(65) Prior Publication Data

US 2015/0236113 A1   Aug. 20, 2015

(30) Foreign Application Priority Data

Feb. 18, 2014 (KR) ........................ 10-2014-0018652

(51) Int. Cl.
*H01L 29/49* (2006.01)
*H01L 29/51* (2006.01)
*H01L 29/08* (2006.01)
*H01L 29/66* (2006.01)
*H01L 29/78* (2006.01)

(52) U.S. Cl.
CPC ....... *H01L 29/4983* (2013.01); *H01L 29/0847* (2013.01); *H01L 29/513* (2013.01); *H01L 29/6653* (2013.01); *H01L 29/7834* (2013.01)

(58) Field of Classification Search
CPC ............ H01L 29/4983; H01L 29/513; H01L 29/0847; H01L 29/6653; H01L 29/7834
See application file for complete search history.

(56) References Cited

U.S. PATENT DOCUMENTS

| | | | |
|---|---|---|---|
| 6,713,357 B1 | 3/2004 | Wang et al. | |
| 7,001,818 B2 | 2/2006 | Tsuchiya et al. | |
| 7,122,449 B2 | 10/2006 | Langdo et al. | |
| 7,812,411 B2 | 10/2010 | Cheng | |
| 7,838,373 B2 | 11/2010 | Giles et al. | |
| 7,843,007 B2 | 11/2010 | Chang et al. | |
| 7,871,869 B2* | 1/2011 | Cartier | H01L 21/28079 438/151 |
| 2013/0049142 A1 | 2/2013 | Liu et al. | |
| 2013/0093019 A1 | 4/2013 | Ando et al. | |
| 2013/0143377 A1 | 6/2013 | Siddiqui et al. | |
| 2015/0380506 A1* | 12/2015 | Wang | H01L 29/4966 257/411 |

OTHER PUBLICATIONS

Elbert Huang et al. "Low-k Spacers for Advanced Low Power CMOS Devices with Reduced Parasitic Capacitances", 2008 IEEE International SOI Conference Proceedings, 2008, 19-20.

* cited by examiner

*Primary Examiner* — Long Pham
(74) *Attorney, Agent, or Firm* — Harness, Dickey & Pierce, P.L.C.

(57) ABSTRACT

A method of manufacturing a field effect transistor using a gate last process includes providing the field effect transistor which includes a high-k dielectric formed between an elevated source and an elevated drain and surrounding a metal gate, and performing a chemical mechanical planarization (CMP) process on an upper surface of the elevated source, and in which a height of the metal gate becomes lower than a height of the elevated source according to the CMP process.

17 Claims, 9 Drawing Sheets

SEMICONDUCTOR DEVICE FOR COMPENSATING INTERNAL DELAY, METHODS THEREOF, AND DATA PROCESSING SYSTEM HAVING THE SAME

CROSS-REFERENCE TO RELATED APPLICATIONS

This application claims priority under 35 U.S.C. §119(a) from Korean Patent Application No. 10-2014-0018652 filed on Feb. 18, 2014, the disclosure of which is hereby incorporated by reference in its entirety.

BACKGROUND

Some example embodiments of the present inventive concepts relate to a technology of manufacturing a field effect transistor (FET) using a gate last process, and more particularly to a method of reducing parasitic capacitance component occurring in the gate last process, and the field effect transistor (FET) manufactured according to the method.

As field effect transistors (FETs) become miniaturized, a short channel effect occurs. The short channel effect means various phenomena which decrease performance of the FET as a gate length of the FET becomes decreasing.

According to the short channel effect, a leakage current of the FET is increased, a punchthrough voltage is decreased, and a current flowing in the FET is not saturated and keeps increasing according to an increase in a drain voltage. For example, the short channel effect may occur when a distance between a source and a drain gets closer according to a process miniaturization. In order to improve the short channel effect, a FET including a high-k dielectric and a metal gate has been developed and used.

SUMMARY

Some example embodiments of the inventive concepts provide a method of manufacturing a field effect transistor which may reduce a large parasitic capacitance component occurring in a gate last process using a high-k dielectric and a metal gate.

Some example embodiments of the inventive concepts provide a method of manufacturing a field effect transistor which may reduce the parasitic capacitance component by physically forming a height of a metal gate to be low, and replacing sidewall layers and a high-k dielectric with a low-k dielectric using an elevated source and an elevated drain formed in a previous process as a stopper of a CMP process without adding a mask or changing a conventional process sequence.

At least one example embodiment of the present inventive concepts is directed to a field effect transistor which is manufactured using a gate last process and includes a high-k dielectric formed over a semiconductor substrate, a metal gate formed over the high-k dielectric, an elevated source formed over a source formed in the semiconductor substrate, and a low-k dielectric formed between the elevated source and the metal gate.

The field effect transistor further includes an inter layer formed between the elevated source and the low-k dielectric, and a dielectric constant of the inter layer is equal to or greater than a dielectric constant of the low-k dielectric. A height of the elevated source is greater than a height of the metal gate.

The field effect transistor further includes a gate oxide formed between the semiconductor substrate and the high-k dielectric, and the low-k dielectric and the gate oxide are formed of the same material. The high-k dielectric does not exist at both sides of the metal gate.

At least one example embodiment of the present inventive concepts is directed to a semiconductor device, including the field effect transistor.

At least one example embodiment of the present inventive concepts is directed to a semiconductor substrate including a high-k dielectric formed on a semiconductor substrate, a metal gate formed on the high-k dielectric, and an elevated source formed on a source formed in the semiconductor substrate, the elevated source being disposed at a side of the metal gate, and a low-k dielectric formed between the elevated source and the metal gate. A bottom surface of the low-k dielectric is connected with an upper surface of the source.

The semiconductor substrate may further comprise a gate oxide formed between the semiconductor substrate and the high-k dielectric.

The gate oxide is formed of substantially the same material as the low-k dielectric.

The semiconductor substrate may further comprise an inter layer formed between the elevated source and the low-k dielectric. A bottom surface of the inter layer is connected with an upper surface of the source.

A dielectric constant of the inter layer is equal to or greater than a dielectric constant of the low-k dielectric.

The high-k dielectric does not exist at both sides of the metal gate.

The semiconductor device is one of a CPU, an application processor, a memory, and a logic circuit.

At least one example embodiment of the present inventive concepts is directed to a method of manufacturing a field effect transistor using a gate last process, including providing the field effect transistor which includes a high-k dielectric that is formed between an elevated source and an elevated drain and surrounds a metal gate, and performing a chemical mechanical planarization (CMP) process on a upper surface of the elevated source, and in which a height of the metal gate becomes lower than a height of the elevated source according to the CMP process.

The method further includes generating a first opening and a second opening by removing a first high-k dielectric formed between the elevated source and the metal gate and a second high-k dielectric formed between the elevated drain and the metal gate through an etching process, and filling the first opening and the second opening with low-k dielectrics.

When the field effect transistor further includes a first inter layer formed between the elevated source and the first high-k dielectric and a second inter layer formed between the elevated drain and the second high-k dielectric, dielectric constants of the first inter layer and the second inter layer are equal to or greater than the low-k dielectric.

According to at least one example embodiment, the low-k dielectric fills the first opening and the second opening through a deposition process. According to at least one example embodiment, the low-k dielectric fills the first opening and the second opening through an interlayer dielectric (ILD) process.

The method further includes removing a first sidewall spacer formed between the elevated source and the first high-k dielectric, and a second sidewall spacer formed between the elevated drain and the second high-k dielectric using the etching process. A semiconductor device according to at least one example embodiment of the present inventive concepts includes the field effect transistor manufactured according to the method.

BRIEF DESCRIPTION OF THE DRAWINGS

These and/or other aspects and advantages of the present inventive concepts will become apparent and more readily appreciated from the following description of the embodiments, taken in conjunction with the accompanying drawings of which.

DETAILED DESCRIPTION OF EMBODIMENTS

Figure 1:
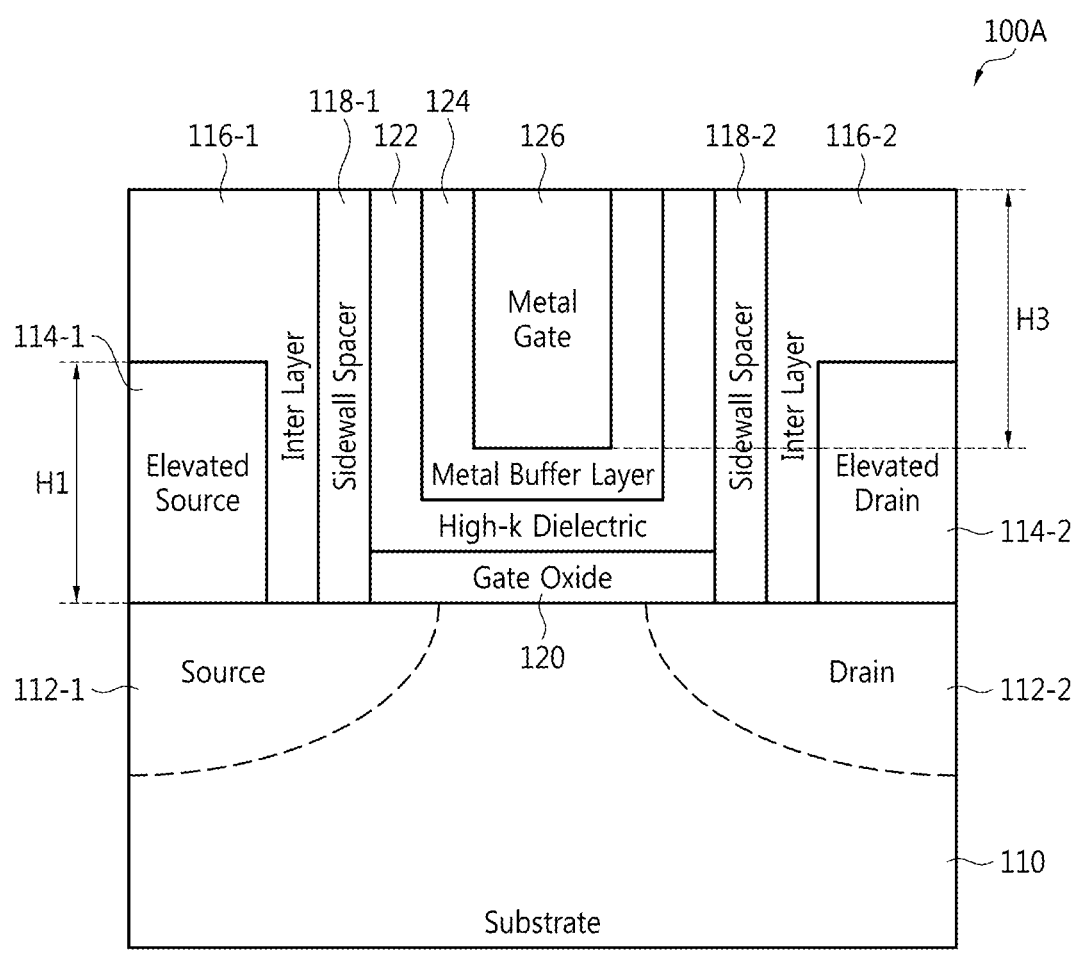
FIG. 1 is a cross-sectional view of a field effect transistor (FET) before a chemical mechanical planarization (CMP) process for describing a method of manufacturing the FET according to at least one example embodiment of the present inventive concepts.

The present inventive concepts now will be described more fully hereinafter with reference to the accompanying drawings, in which embodiments of the invention are shown. This invention may, however, be embodied in many different forms and should not be construed as limited to the embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the manufacture of a semiconductor, a low-k dielectric means a material which has a dielectric constant relatively lower than silicon dioxide (SiO2). Moreover, a high-k dielectric means a material which has a dielectric constant relatively higher than SiO2. A dielectric constant of SiO2 which is an insulating material used in silicon chips is 3.9.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view of a field effect transistor (FET) before a chemical mechanical planarization (CMP) process for describing a method of manufacturing the FET according to at least one example embodiment of the present inventive concepts. FIG. 1 shows a cross-sectional view of a field effect transistor (FET) 100A manufactured in a gate stack step of a gate last process.

The FET 100A includes a source or source region 112-1 and a drain or drain region 112-2 formed in a semiconductor substrate 110. An elevated source or elevated source region 114-1 is formed on the source region 112-1, and an elevated drain or elevated drain region 114-2 is formed on the drain region 112-2.

A (vertical) inter layer 116-1 and a (vertical) sidewall spacer 118-1 are formed between the elevated source 114-1 and the high-k dielectric 122, and a (vertical) inter layer 116-2 and a (vertical) sidewall spacer 118-2 are formed between the elevated drain 114-2 and the high-k dielectric 122.

The elevated source 114-1 may mean a high-raised source, and the elevated drain 114-2 may mean a high-raised drain. When all or a portion of a source region and a drain region are formed above a channel, the source region and the drain region may be referred to as a high-raised or elevated source region and a high-raised or elevated drain region.

FETs 100A to 100E including the elevated source 114-1 and the elevated drain 114-2 may decrease or remove a short channel effect and a drain-induced barrier lowering (DIBL) effect of scaled submicron transistors.

A gate oxide or a gate dielectric 120 is formed on the semiconductor substrate 110. When a metal buffer layer 124 is not formed, the high-k dielectric 122 may be formed so as to cover a bottom and both sides of a metal gate 126. When the metal buffer layer 124 is formed, the metal buffer layer 124 may be formed between the high-k dielectric 122 and the metal gate 126. According to at least one example embodiment, the metal gate 126 may be replaced with poly-silicon.

A material of the metal buffer layer 124 can be changed according to a type of the FET (for example, an n-type FET or a p-type FET), and the number of metal buffer layers 124 can be changed according to a type of the FET. As described above, the metal buffer layer 124 may be embodied or may not be embodied.

For convenience of description, FIG. 1 illustrates a cross-sectional view after each configuration element 112-1, 112-2, 114-1, 114-2, 116-1, 116-2, 118-1, 118-2, 122, 124, and 126 is formed, so that a process of forming or manufacturing the configuration elements 112-1, 112-2, 114-1, 114-2, 116-1, 116-2, 118-1, 118-2, 122, 124, and 126 can be variously changed according to a manufacturer. As illustrated in FIG. 1, a height H1 of the elevated source 114-1 may be smaller than a height H3 of the metal gate 126.

Figure 2:
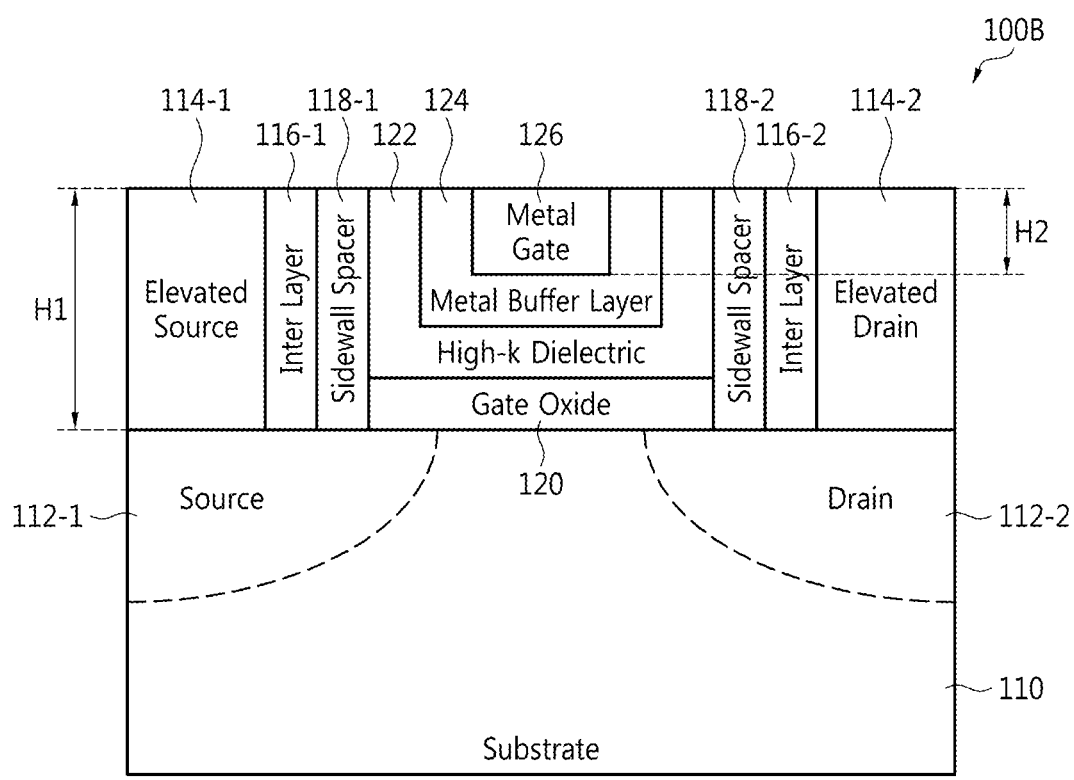
FIG. 2 is a cross-sectional view of the FET after the CMP process.

FIG. 2 is a cross-sectional view of the FET after the CMP process. Referring to a FET 100B of FIG. 2, the CMP process is performed on an upper surface of each of the elevated source 114-1 and the elevated drain 114-2. That is, each of the elevated source 114-1 and the elevated drain 114-2 may perform a function of a stopper in the CMP process.

According to the CMP process, a height H1 of the elevated source 114-1 and a height H1 of the elevated drain 114-2 may be equally formed. In addition, a height H2 of the metal gate 126 may be embodied lower than the height H1 of the elevated source 114-1 according to the CMP process. As the height H2 of the metal gate 126 is embodied lower than the height H1 of the elevated source 114-1, a parasitic capacitance component is physically decreased more than when a height H3 of the metal gate 126 illustrated in FIG. 1 is embodied higher than the height H1 of the elevated source 114-1.

Figure 3:
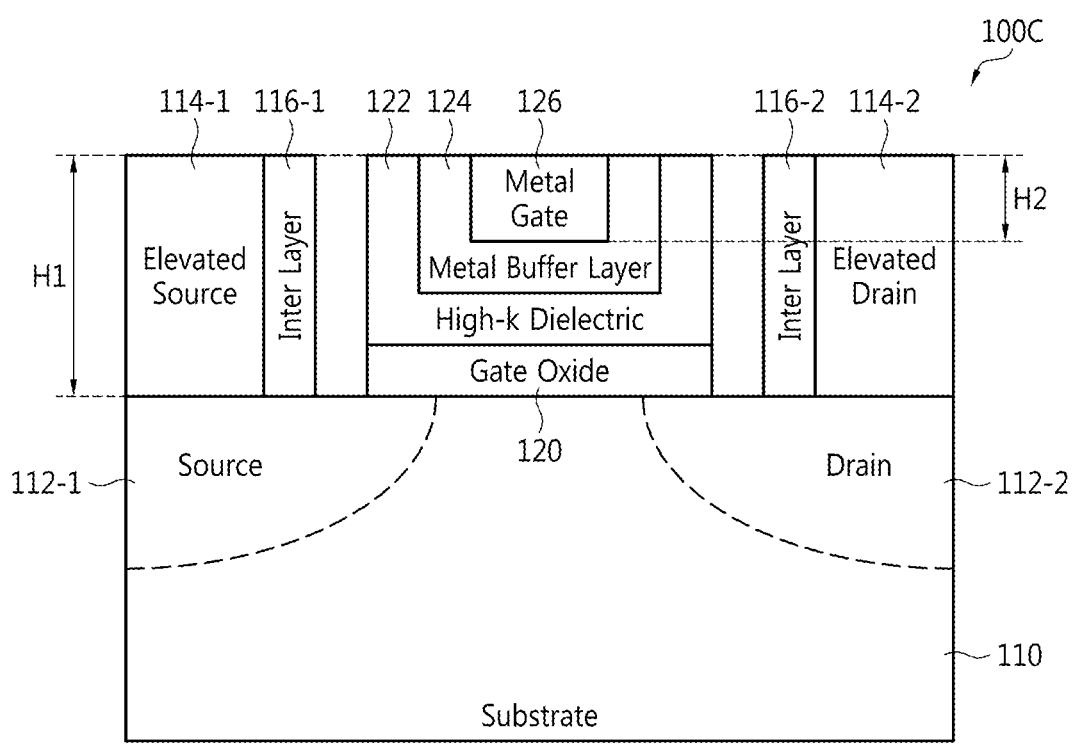
FIG. 3 is a cross-sectional view of the FET after removing a sidewall spacer.

FIG. 3 is a cross-sectional view of the FET after removing a sidewall spacer. Referring to a FET 100C of FIG. 3, each sidewall spacer 118-1 and 118-2 is removed through an etching process.

Figure 4:
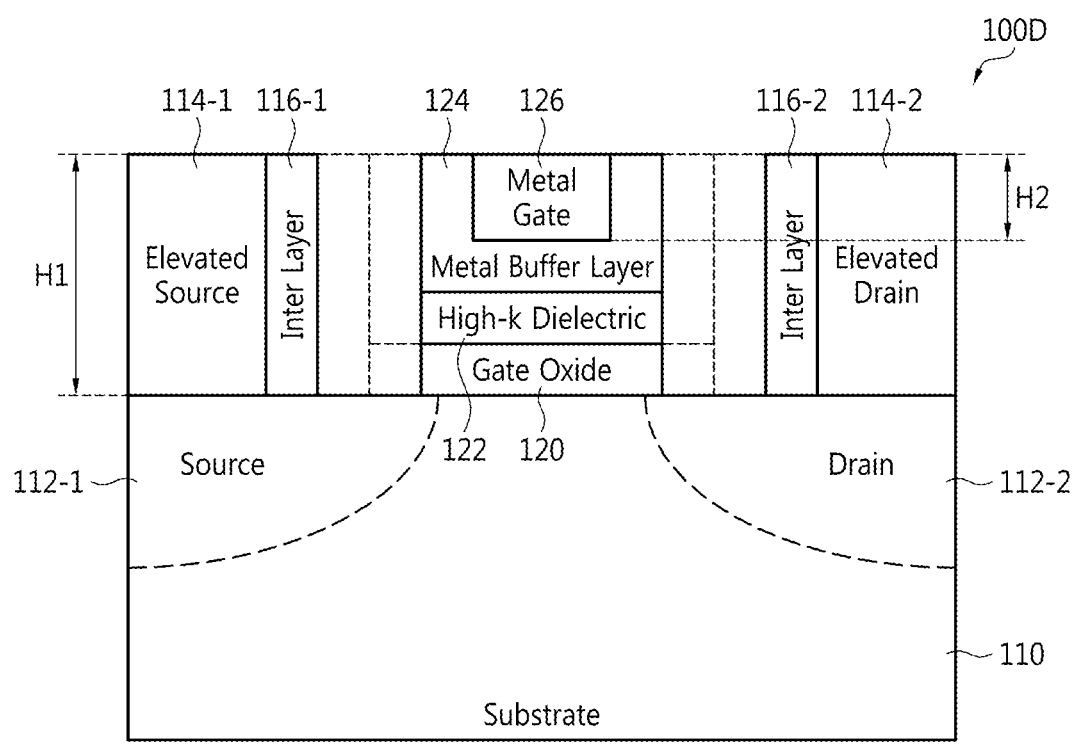
FIG. 4 is a cross-sectional view of the FET after removing a high-k dielectric.

FIG. 4 is a cross-sectional view of the FET after removing a high-k dielectric. Referring to a FET 100D of FIG. 4, a high-k dielectric formed at both sides of the metal gate 126 in the high-k dielectric 122 is removed through an etching process. At this time, both sides of a gate oxide 120 are removed through the etching process.

For convenience of description in FIGS. 3 and 4, it is illustrated that the high-k dielectric formed at both sides of the metal gate 126 is removed through the etching process after each sidewall spacer 118-1 and 118-2 is removed; however, the high-k dielectric formed at both sides of the metal gate 126 may be removed prior to each sidewall spacer 118-1 and 118-2 according to some example embodiments, or each sidewall spacer 118-1 and 118-2 and the high-k dielectric formed at both sides of the metal gate 126 may be simultaneously removed.

Figure 5:
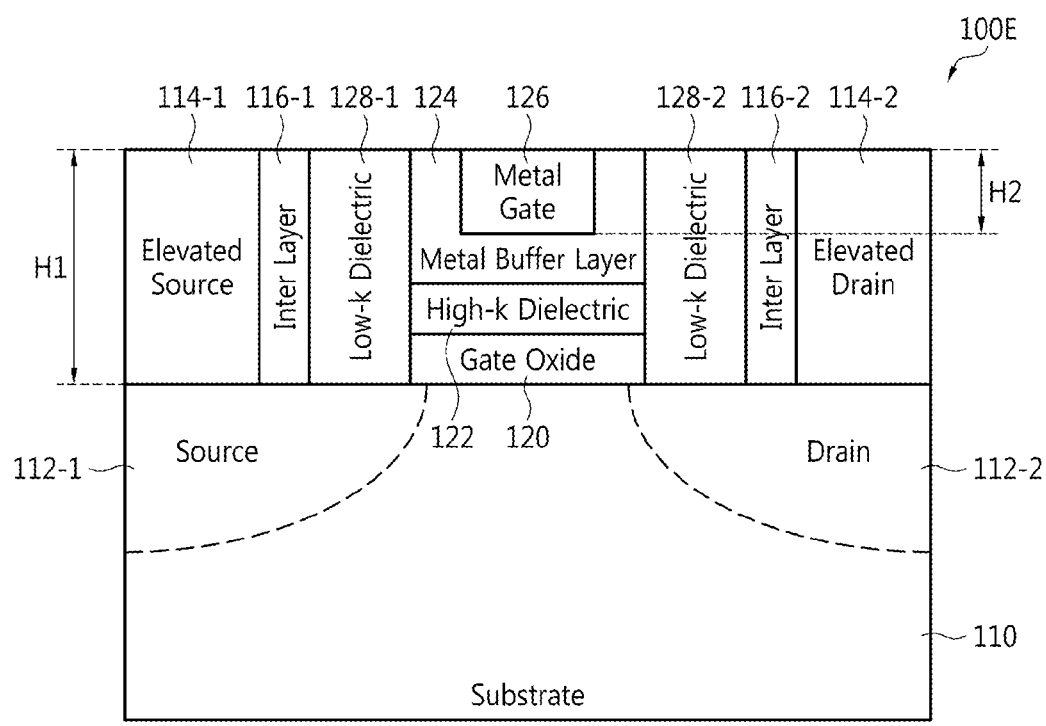
FIG. 5 is a cross-sectional view of the FET after depositing a low-k dielectric.

FIG. 5 is a cross-sectional view of the FET after depositing a low-k dielectric. Referring to a FET 100E of FIG. 5, openings generated after the sidewall spacer 118-1 and 118-2 and the high-k dielectric formed on the both sides of the metal gate 126 are removed are filled with a low-k dielectric 128-1 and 128-2 through a deposition process.

That is, the sidewall spacers 118-1 and 118-2 and the high-k dielectric formed at both sides of the metal gate 126 are replaced with the low-k dielectrics 128-1 and 128-2. For example, the low-k dielectrics 128-1 and 128-2 may be SiO2.

A dielectric constant of each of the inter layers 116-1 and 116-2 may be equal to or greater than a dielectric constant of the low-k dielectric 128-1 and 128-2. For example, each of the inter layers 116-1 and 116-2 may be SiO2.

As the sidewall spacers 118-1 and 118-2 and the high-k dielectric formed at both sides of the metal gate 126 are replaced with the low-k dielectrics 128-1 and 128-2, a parasitic capacitance component may be considerably decreased.

Since a process of replacing the sidewall spacers 118-1 and 118-2 and the high-k dielectric formed at both sides of the metal gate 126 with the low-k dielectrics 128-1 and 128-2 is performed right before a back end process, the FET 100D having a structure illustrated in FIG. 4 may improve only an AC characteristic while maintaining a DC characteristic as it is.

According to at least one example embodiment, the process of replacing the sidewall spacers 118-1 and 118-2 and the high-k dielectric formed at both sides of the metal gate 126 with the low-k dielectric 128-1 and 128-2 may be performed in an inter layer dielectric (ILD).

Figure 6:
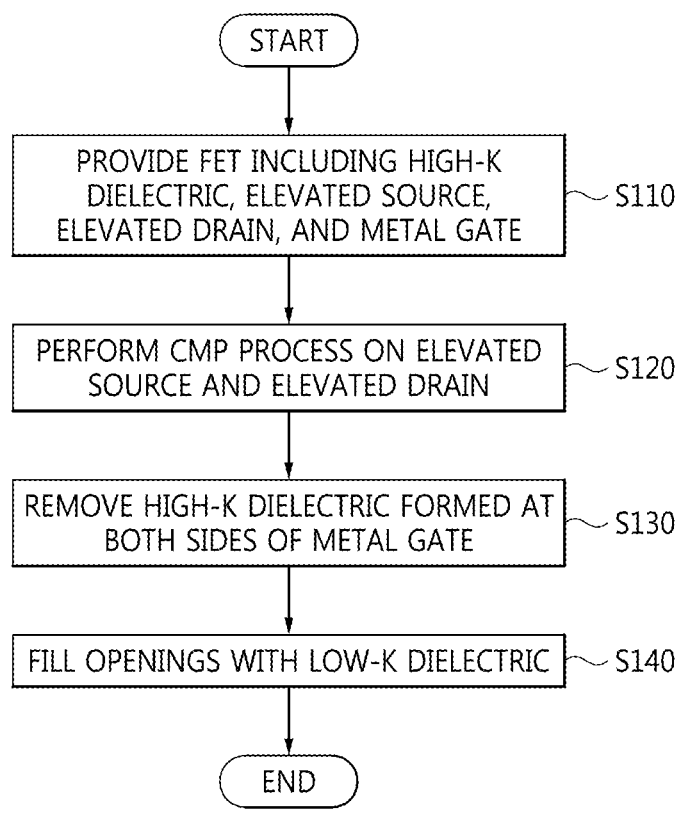
FIG. 6 is a flowchart for describing an example embodiment of a method of manufacturing the FET according to at least one example embodiment of the present inventive concepts.

FIG. 6 is a flowchart for describing a method of manufacturing the FET according to at least one example embodiment of the present inventive concepts. Referring to FIGS. 1 to 6, the FET 100A illustrated in FIG. 1 is provided (S110).

By using the elevated source 114-1 as a CMP stopper, the CMP process for the FET 100B is performed as illustrated in FIG. 2 (S120). That is, the CMP process is performed on the upper (or top) surface of the elevated source 114-1 (S120). According to the CMP process, a height H2 of the metal gate 126 or a height of a gate stack becomes lower than the height H3 of the metal gate 126 illustrated in FIG. 1 or a height of the gate stack.

The high-k dielectric formed at both sides of the metal gate 126 and both sides of the gate oxide 120 are removed through an etching process like the FET 100D illustrated in FIG. 4 (S130). Openings formed through the etching process are filled with the low-k dielectrics 128-1 and 128-2 through the deposition process like the FET 100E illustrated in FIG. 5 (S140).

Figure 7:
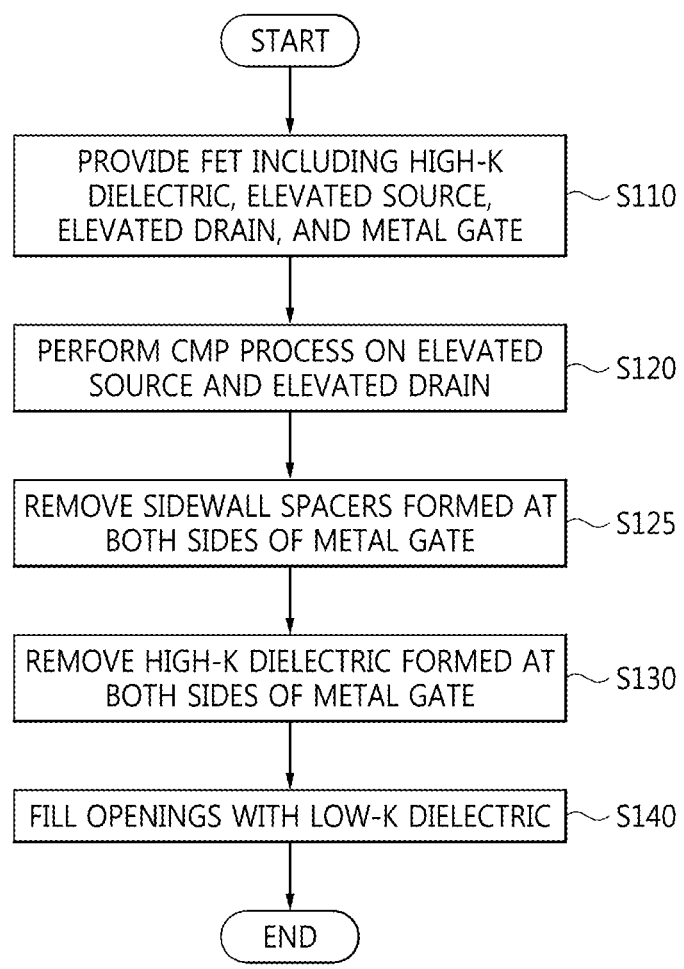
FIG. 7 is a flowchart for describing another example embodiment of the method of manufacturing the FET according to at least one example embodiment of the present inventive concepts.

FIG. 7 is a flowchart for a method of manufacturing the FET according to at least one example embodiment of the present inventive concepts. Referring to FIGS. 6 and 7, the sidewall spacers 118-1 and 118-2 may be removed prior to all of high-k dielectrics formed at both sides of the metal gate 126 (S125).

Figure 8:
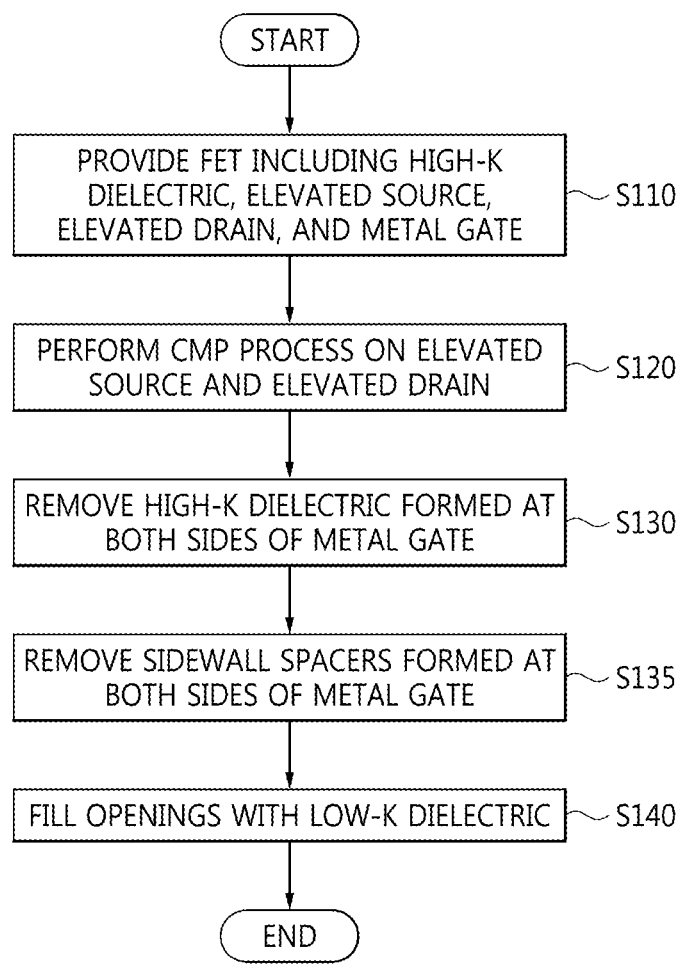
FIG. 8 is a flowchart for describing still another example embodiment of the method of manufacturing the FET according to at least one example embodiment of the present inventive concepts.

FIG. 8 is a flowchart for describing a method of manufacturing the FET according to at least one example embodiment of the present inventive concepts. Referring to FIGS. 6 and 8, the sidewall spacers 118-1 and 118-2 may be removed later than all of the high-k dielectrics formed at both sides of the metal gate 126 (S135). A method of manufacturing a field effect transistor described referring to FIGS. 1 to 8 may be applied to not only a method of manufacturing a 2D planar FET but also to a method of manufacturing a 3D FinFET.

Figure 9:
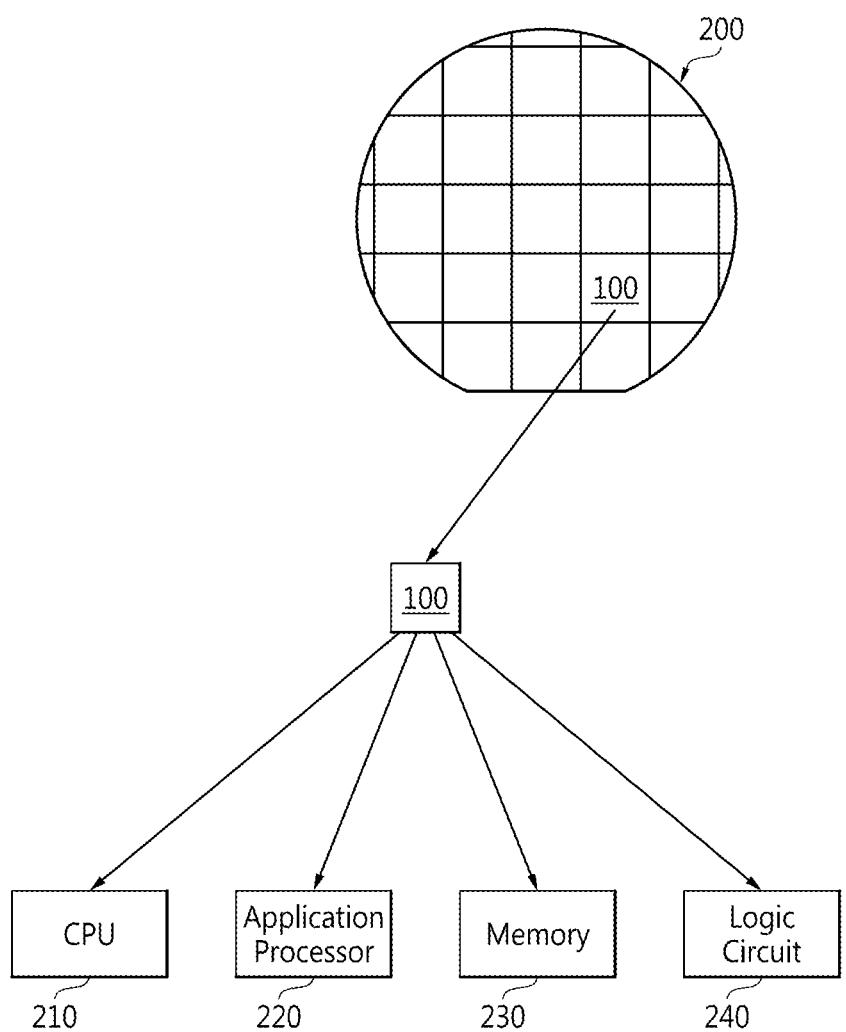
FIG. 9 is a semiconductor chip including the FET according to at least one example embodiment of the present inventive concepts and a semiconductor device including the semiconductor chip.

FIG. 9 illustrates a semiconductor chip including the FET according to at least one example embodiment of the present inventive concepts and a semiconductor device including the semiconductor chip. A semiconductor wafer 200 may be manufactured using the manufacturing method described through FIGS. 1 to 8. The semiconductor wafer 200 includes a plurality of chips 100.

Each semiconductor chip 100 may be used in various semiconductor devices. For example, the semiconductor chip 100 may be used in a CPU 210, an application processor 220, a memory 230, and a logic circuit 240.

Since an elevated source and an elevated drain may be used as a stopper of the CMP process when without adding a mask or performing the CMP process without a change in a conventional process sequence, a field effect transistor manufactured using a gate last process according to at least one example embodiment of the present inventive concepts may make a height of a metal gate lower than a height of a metal gate in a conventional FET. As a height of the metal gate becomes lowered, a parasitic capacitor component may be physically decreased.

In addition, the field effect transistor (FET) manufactured using a gate last process according to at least one example embodiment of the present inventive concepts may replace sidewall layers and high-k dielectrics formed at both sides of a metal gate with low-k dielectrics, and thus the parasitic capacitance component may be further decreased. The field effect transistor (FET) manufactured using the gate last process according to at least one example embodiment of the present inventive concepts may structurally decrease the parasitic capacitance component, and thereby an AC characteristic may be improved.

While the present inventive concepts have been particularly shown and described with reference to example embodiments thereof, it will be understood by those of ordinary skill in the art that various changes in forms and details may be made therein without departing from the spirit and scope of the present inventive concepts as defined by the following claims.

What is claimed is:

1. A field effect transistor (FET) manufactured using a gate last process, the FET comprising:
   a metal gate having first and second sides perpendicular to a top surface of a semiconductor substrate;
   a high-k dielectric on the semiconductor substrate, the high-k dielectric surrounding a bottom surface and the first and second sides of the metal gate;
   an elevated source on a source region in the semiconductor substrate;
   a low-k dielectric between the elevated source and the metal gate;
   a metal buffer layer between the high-k dielectric and the metal gate; and
   a gate oxide between the semiconductor substrate and the high-k dielectric, wherein
      the low-k dielectric and the gate oxide are formed of a same material.

2. The FET of claim 1, further comprising:
   an inter layer between the elevated source and the low-k dielectric,
   wherein a dielectric constant of the inter layer is equal to or greater than a dielectric constant of the low-k dielectric.

3. The FET of claim 1, wherein a height of the elevated source is higher than a height of the metal gate.

4. The FET of claim 1, wherein the low-k dielectric is silicon dioxide (SiO2).

5. A semiconductor device comprising:
   a field effect transistor (FET) manufactured using a gate last process, the FET including,
      a metal gate having first and second sides perpendicular to a top surface of a semiconductor substrate;
      a high-k dielectric on the semiconductor substrate, the high-k dielectric surrounding a bottom surface and the first and second sides of the metal gate;
      an elevated source on a source region in the semiconductor substrate;
      a low-k dielectric between the elevated source and the metal gate;
      a metal buffer layer between the high-k dielectric and the metal gate; and
      a gate oxide between the semiconductor substrate and the high-k dielectric, wherein
         the low-k dielectric and the gate oxide are formed of a same material.

6. The semiconductor device of claim 5, further comprising:
   an inter layer between the elevated source and the low-k dielectric, wherein a dielectric constant of the inter layer is equal to or greater than a dielectric constant of the low-k dielectric.

7. The semiconductor device of claim 5, wherein a height of the elevated source is higher than a height of the metal gate.

8. The semiconductor device of claim 5, wherein the low-k dielectric is silicon dioxide (SiO2).

9. The semiconductor device of claim 5, wherein the semiconductor device is one of a CPU, an application processor, a memory, and a logic circuit.

10. A semiconductor device comprising:
    a metal gate having first and second sides perpendicular to a top surface of a semiconductor substrate;
    a high-k dielectric on the semiconductor substrate, the high-k dielectric surrounding a bottom surface, the first and the second sides of the metal gate;
    an elevated source on a source region in the semiconductor substrate, the elevated source being disposed at a side of the metal gate; and
    a low-k dielectric between the elevated source and the metal gate, a bottom surface of the low-k dielectric being connected with an upper surface of the source, wherein
       the low-k dielectric has an upper surface having a height that is same as a height of the elevated source.

11. The semiconductor device of claim 10, further comprising:
    a metal buffer layer between the high-k dielectric and the metal gate; and
    a gate oxide between the semiconductor substrate and the high-k dielectric.

12. The semiconductor device of claim 11, wherein the gate oxide is formed of substantially the same material as the low-k dielectric.

13. The semiconductor device of claim 10, further comprising:
   an inter layer between the elevated source and the low-k dielectric,
   wherein a bottom surface of the inter layer is connected with the upper surface of the source.

14. The semiconductor device of claim 13, wherein a dielectric constant of the inter layer is equal to or greater than a dielectric constant of the low-k dielectric.

15. The semiconductor device of claim 10, wherein the semiconductor device is one of a CPU, an application processor, a memory, and a logic circuit.

16. The FET of claim 1, wherein the low-k dielectric has an upper surface having a height that is same as a height of the elevated source.

17. The semiconductor device of claim 5, wherein the low-k dielectric has an upper surface having a height that is same as a height of the elevated source.

\* \* \* \* \*